United States Patent [19]
Satoh

[11] Patent Number: 6,104,216
[45] Date of Patent: Aug. 15, 2000

[54] DIFFERENTIAL AMPLIFIER HAVING A REDUCED CURRENT DISSIPATION

[75] Inventor: Tomohiko Satoh, Tokyo, Japan

[73] Assignee: NEC Corporation, Tokyo, Japan

[21] Appl. No.: 09/107,502

[22] Filed: Jun. 30, 1998

[30] Foreign Application Priority Data

Jun. 30, 1997 [JP] Japan ................................. 9-173916

[51] Int. Cl.[7] .............................................. H03K 5/22
[52] U.S. Cl. .............................. 327/78; 327/53; 327/89
[58] Field of Search .................................. 327/53, 66, 77, 327/78, 88, 89

[56] References Cited

U.S. PATENT DOCUMENTS

4,642,489  2/1987  Wilcox ........................................ 307/514
5,343,086  8/1994  Fung et al. ................................... 327/77
5,488,322  1/1996  Kaplinsky .................................... 327/74

*Primary Examiner*—Jung Ho Kim
*Attorney, Agent, or Firm*—Foley & Lardner

[57] ABSTRACT

A differential circuit used in an input interface of a memory device comprises a current mirror including a pair of P-channel transistors, a differential pair including a pair of N-channel transistors for receiving a reference voltage and an input signal voltage, respectively, and another N-channel transistor connected between the common sources of the pair of N-channel transistors and GND line. The another N-channel transistor has a gate maintained at a constant potential irrespective of the fluctuations of the source voltage, thereby suppressing a current increase due to variations of the source voltage and reference voltage. The constant voltage is generated in the memory device itself and used for another purpose.

5 Claims, 13 Drawing Sheets

DIFFERENTIAL AMPLIFIER HAVING A REDUCED CURRENT DISSIPATION

BACKGROUND OF THE INVENTION (a). Field of the Invention

The present invention relates to a differential amplifier having a reduced current dissipation, and more particularly, to a differential amplifier suitable for use in an input interface of a memory device, (b). Description of the Related Art Along with the recent development of the operational speed of microprocessors for use in workstations and personal computers, a dynamic random access memory (DRAM), which is one of peripheral devices for the microprocessors, is required to operate at a higher frequency as high as 100 MHz or more. A synchronous DRAM (SDRAM) operable in synchrony with an external clock signal is known as one of the higher operational speed memories.

Figure 1:
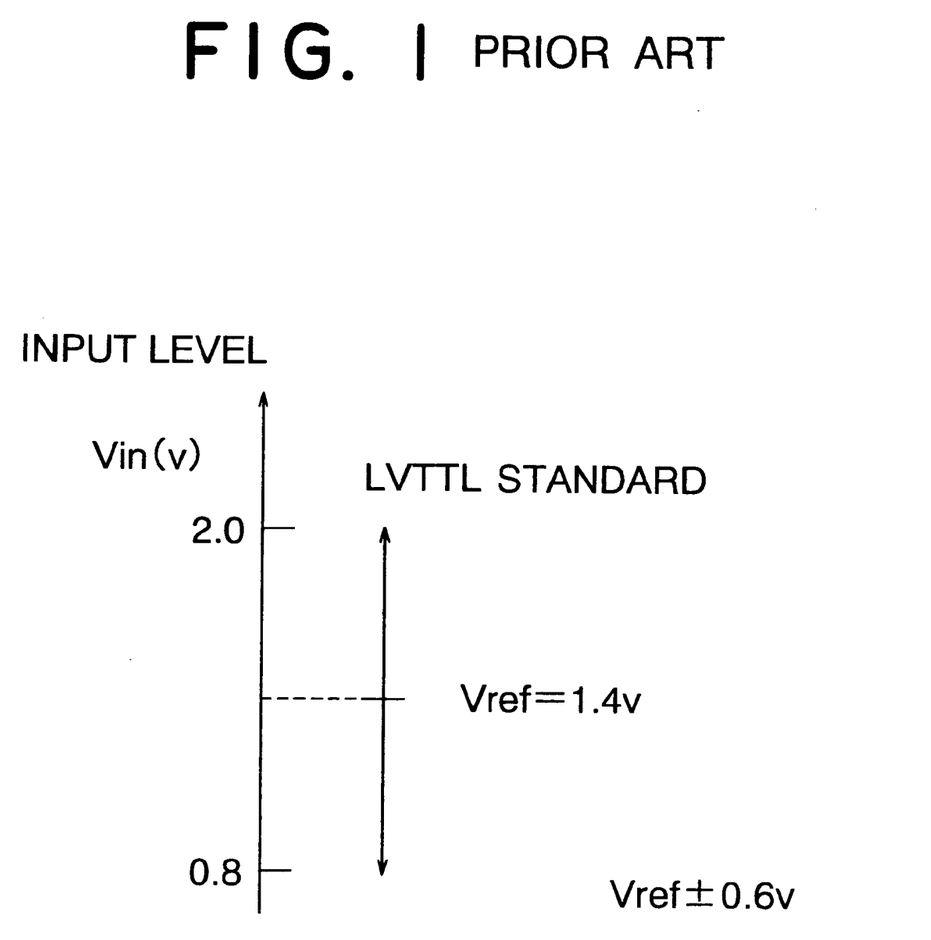
FIG. 1 is a graph of the input signal level specified in the LVTTL standard.

Thus, an input interface for use in a memory device as a first stage amplifier which receives external signals to transmit the same after converting to a voltage level for the memory device is also required to operate at a higher speed. LVTTL standard is known as a conventional international standard specifying the input signal level of the input interfaces. FIG. 1 is a graph of the input signal level specified in the LVTTL standard, wherein +0.8 volts to +2.0 volts for an input signal amplitude is specified. The input signal amplitude is generally unchanged in the LVTTL standard even if the source voltage is changed. In this configuration, the input reference voltage Vref is determined at the median between 0.8 and 2.0 volts, namely, at 1.4 volts by designers for the input interface.

For a higher operational speed, it is required more recently to shift the standard of the input signal amplitude from the conventional LVTTL standard to a new SSTL standard which specifies smaller input signal amplitudes. Thus, input receivers of the input interfaces are requested for satisfying both the LVTIT and SSTL standards during the transition period of the standard.

Figure 2:
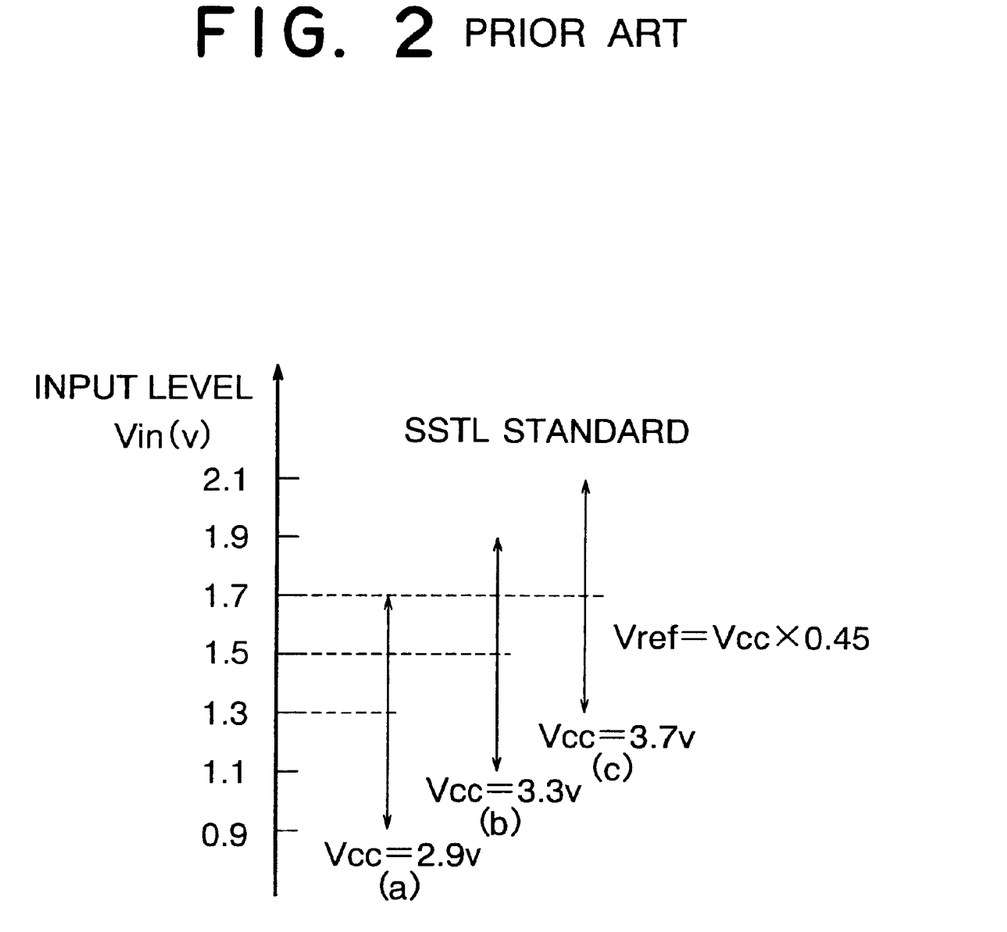
FIG. 2 is a graph of the input signal level specified in the SSTL standard.

FIG. 2 is a graph of the input signal amplitude specified in the SSTL standard, wherein the specification of the reference voltage Vref is introduced along with the level of the input signal amplitude, although Vref is not specified in the LVTTL standard The reference voltage Vref varies while keeping the relationship of Vref=0.45×Vcc with the external source voltage Vcc. The level for the input signal amplitude is provided therein such that L-level is specified at −0.4 volts from Vref and H-level is specified at +0.4 volts from Vref for a transient change, whereas L-level is specified at −0.2 volts from Vref and H-level is specified at +0.2 volts from Vref for a stationary change.

Figure 3:
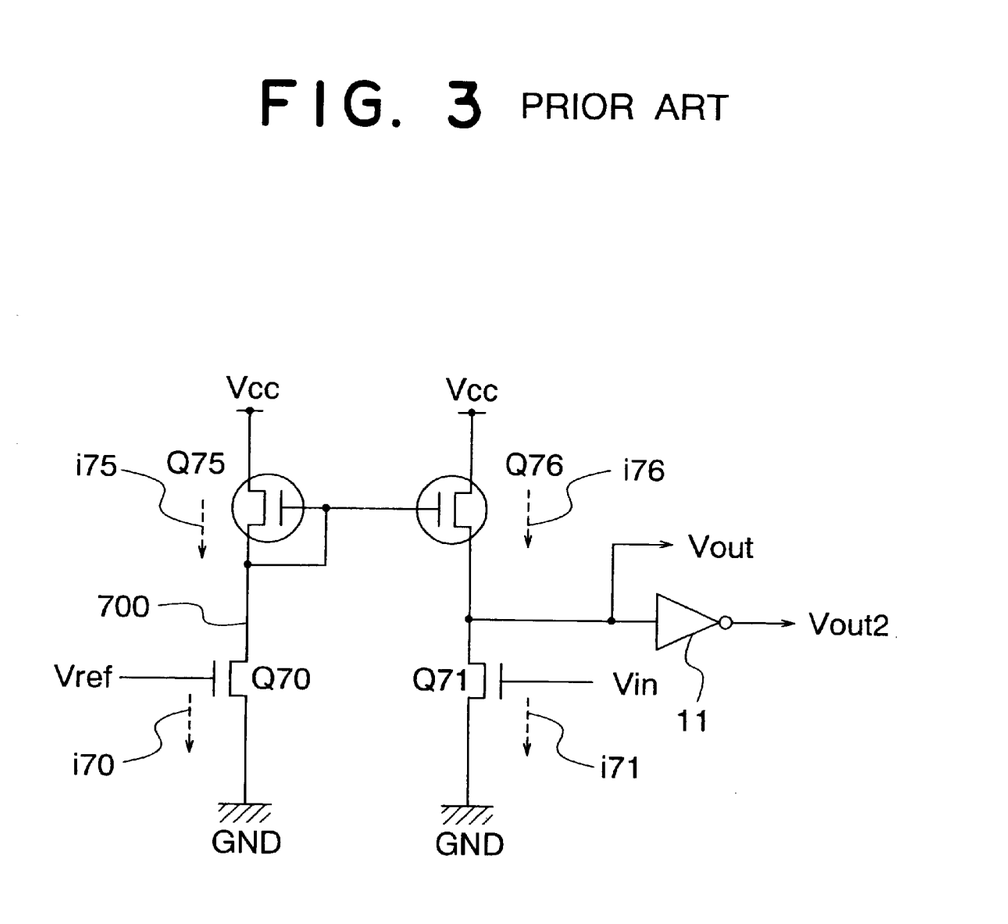
FIG. 3 is a circuit diagram of a first conventional differential circuit.

A conventional input interface adapted to the LVTTL standard uses a differential amplifier such as shown in FIG. 3. The differential amplifier used in a SDRAM comprises: an N-channel transistor Q71 having a gate for receiving an external input signal Vin and a source connected to ground (GND); an N-channel transistor Q70 having a gate for receiving the reference voltage Vref generated in the SDRAM and a source connected to GND; a P-channel transistor Q75 having a gate and a drain connected together to the drain of transistor Q70 at a node 700, and a source connected to a power source line Vcc; and a P-channel transistor Q76 having a drain connected to the drain of transistor Q71, a gate connected to the gate and the drain of transistor Q71 and a source connected to power source line Vcc.

As shown in FIG. 1, the amplitude of input signal Vin is +0.8 to +2.0 volts in the LVTTL standard, and accordingly, reference voltage Vref is set at 1.4V which is the median voltage between H-level and L-level. That is, Vin=Vref±0.6V.

The gate widths "W" as well as the gate lengths "L" are equal between N-channel transistors Q70 and Q71. Similarly, "W" and "L" are respectively equal between P-channel transistors Q75 and Q76. The currents flowing through transistors Q70, Q71, Q75 and Q76 are represented by i70, i71, i75 and i76, respectively.

Since reference voltage Vref is input to the gate of transistor Q70, the drain of which is connected to the drain of transistor Q75 at node 700, i75 and i70 are equal and constitute a constant current. Transistor Q75 and transistor Q76 form a current mirror, thus i75=i76.

If input voltage Vin is equal to the reference voltage Vref in the differential circuit of FIG. 3, then i71=i76=i70 so that the following relationship holds:

$$i70=i75=i76=i71=ia \text{ (where Vin=Vref)} \qquad (1),$$

wherein ia is a constant current. The output node Vout connecting drains of transistors Q71 and Q76 together is connected to the input of an inverter I1.

Figure 4:
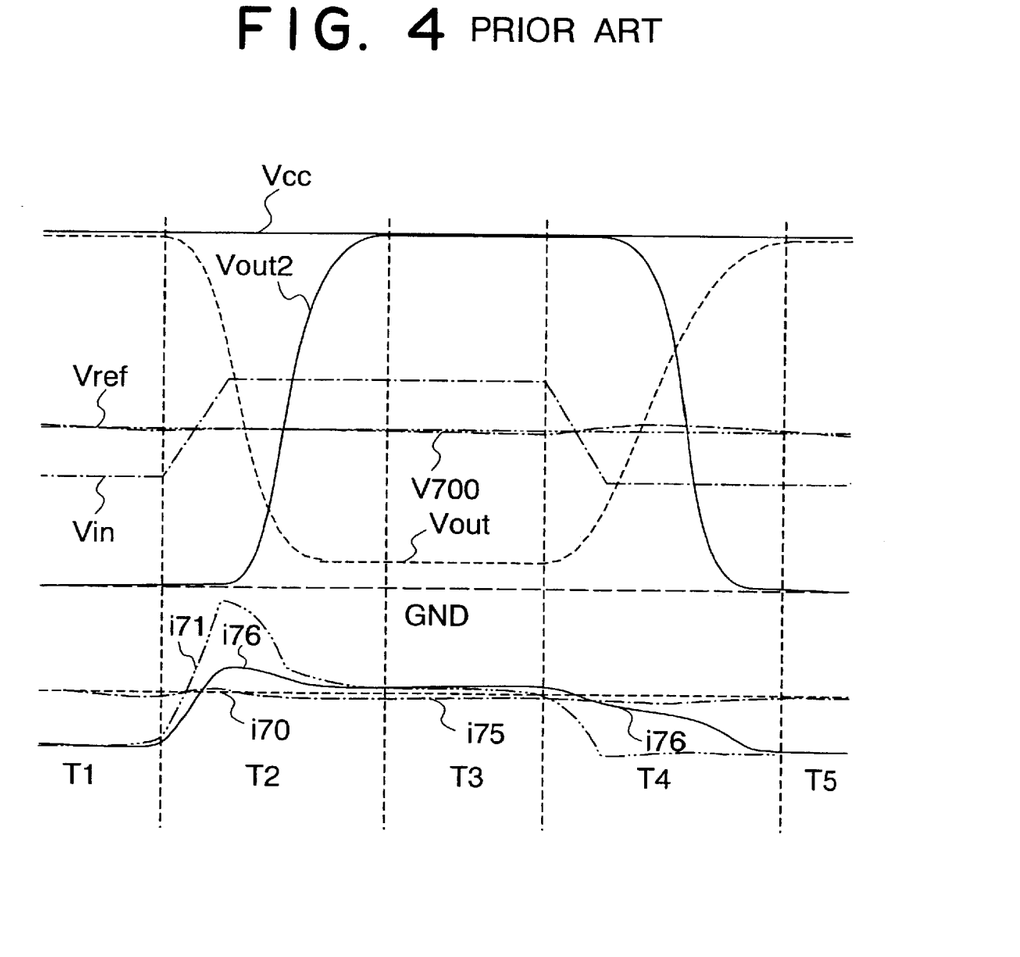
FIG. 4 is a signal timing chart of the differential circuit of FIG. 3.

FIG. 4 is a signal timing chart of the conventional differential amplifier of FIG. 3. Input signal Mm stays at L-level during time interval T1, rises from L-level to H-level during T2, stays at H-level during T3, falls from H-level to L-level during T4, and again stays at L-level during T5.

During time intervals T1 and T5 where input signal Vin assumes L-level in a stationary state, input signal Vin is lower than reference voltage Vref. Thus, the gate-source voltage Vgs of transistor Q71 is lower than the gate-source voltage Vgs of transistor Q70, and current i71 is smaller than current i70. The equality of the gate-source voltage Vgs of transistor Q76 and the gate-source voltage Vgs of transistor Q75 signifies the equality of currents i76 and i75.

Accordingly, during time intervals T1 and T5, if i71=ib wherein ib is a constant current, the following relationship holds:

$$i70=i75=i76=ia>i71=ib \qquad (2).$$

With reference to relationship (1) as noted above, the current (or current gain of the differential amplifier) for charging the gate capacitance of inverter I1 during the rise of the input voltage Vin is expressed by:

$$i76-i71=ia-ib \qquad (3).$$

By the current gain ia−ib, the level of output signal Vout of the differential circuit rises to around power source voltage Vcc, whereas the output signal Vout2 from inverter I1 falls to GND potential. After the charging is finished in T12, relationship i70=i75>i76=i71 holds.

During time interval T3, input signal Vin is higher than reference voltage Vref in a stationary state, and the gate-source voltage Vgs of transistor Q71 is higher than the gate-source voltage Vgs of transistor Q70. Thus, current i71 is larger than current i70. Accordingly, the following relationship holds:

$$i70=i75=i76=ia<i71=ic \qquad (4),$$

wherein ic represents the current flowing through transistor Q71 in T3. The current gain in T3 for charging the gate capacitance of inverter I1 is expressed by:

$$i71-i76=ic-ia \qquad (5).$$

The level of output voltage Vout falls from around power source voltage Vcc to around GND potential. Output voltage Yout2 of inverter Ii rises to around power source voltage Vcc. After the discharging, the following relationship holds:

$$i70=i75<i76=i71.$$

During time interval T2 where input signal Vin rises from L-level to H-level, current i71 gradually increases, and the drain-source voltage Vds of transistor Q76 rises with the discharge of the gate capacitance of inverter I1. Thus, current i76 also increases and Vout falls to L-level after the discharge, and currents i71 and i76 stay at a constant level.

During time interval T4 where input signal Vin falls from H-level to L-level, current i71 gradually decreases, and the drain-source voltage Vds of transistor Q76 falls with the charging of the gate capacitance of inverter I1. Thus, current i76 also decreases and Vout rises to H-level after the charging, and currents i71 and i76 stay at a constant level.

Figure 5:
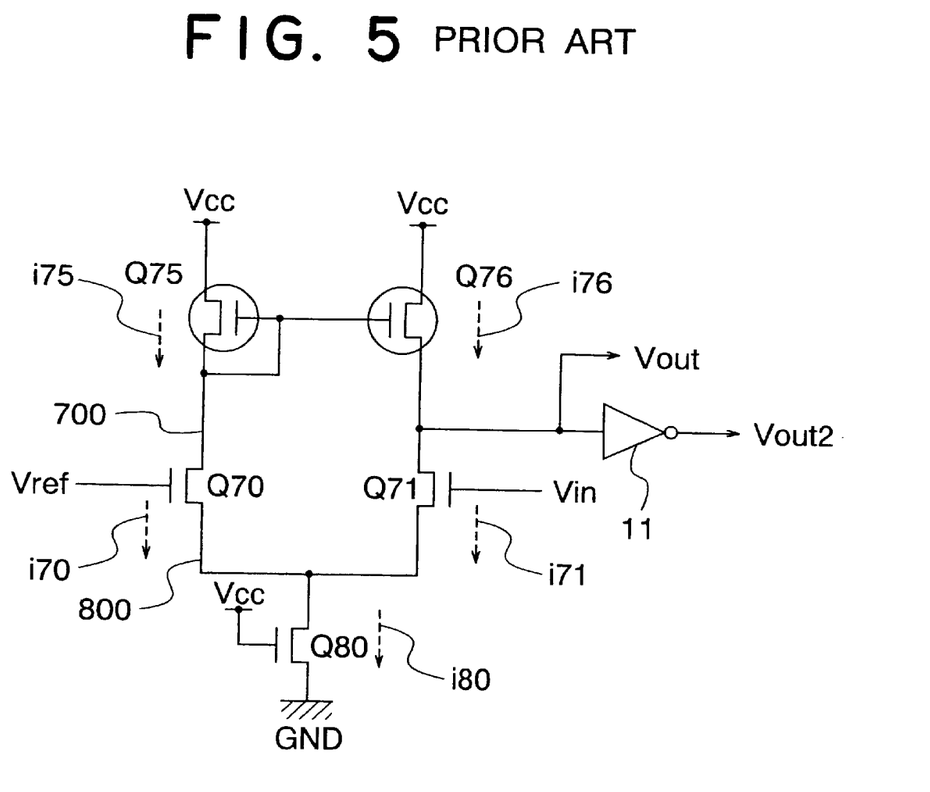
FIG. 5 is a circuit diagram of a second conventional differential circuit.

FIG. 5 is a circuit diagram of another conventional differential amplifier for use as an input interface adapted to the LVTTL standard. In the figure, constituent elements similar to those in FIG. 3 are designated by the same or similar reference numerals. In the differential amplifier shown in FIG. 5, N-channel transistor Q80 has a drain connected to both the sources of N-channel transistors Q70 and Q71, a source connected to GND and a gate applied with power source voltage Vcc.

Figure 6:
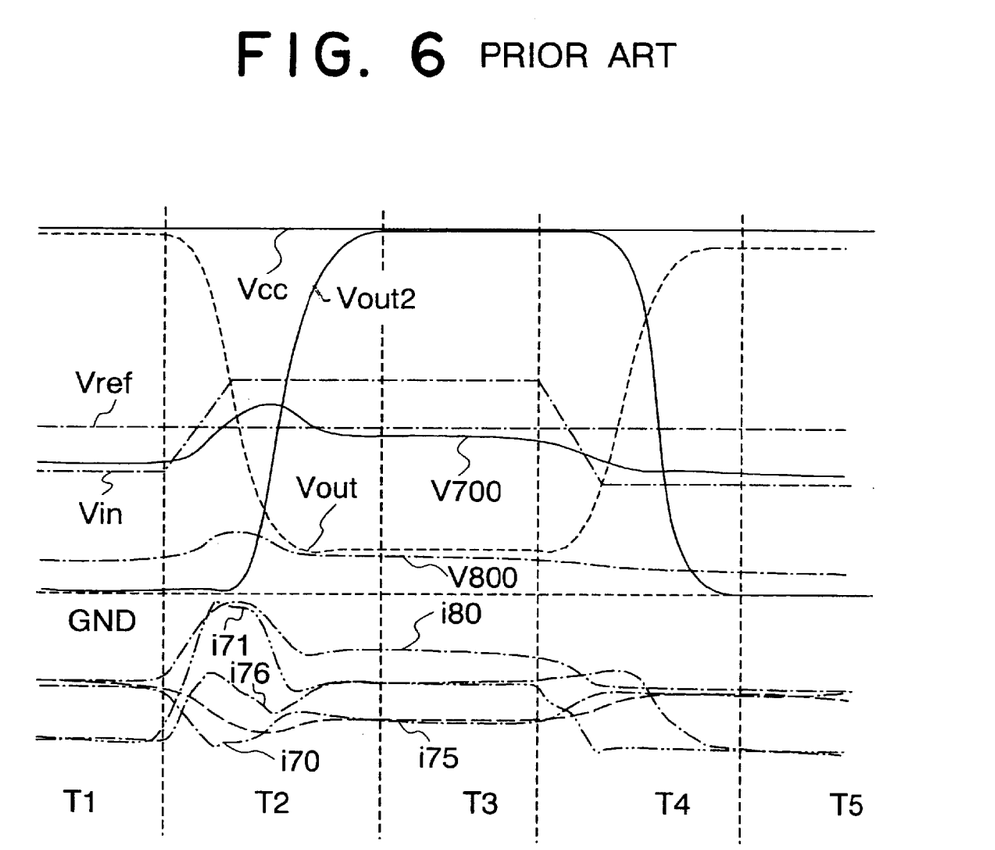
FIG. 6 is a signal timing chart of the differential circuit of FIG. 5.

Assuming that W/L dimensions of transistors Q70 and Q75 are equal to W/L dimensions of transistors Q71 and Q76, respectively, when input signal Vin is equal to reference voltage Vref, current equal to half the current i80 flowing through transistor Q80 flows through each of transistors Q70, Q71, Q75 and Q76. For comparing with the differential amplifier of FIG. 3 it is assumed that in FIG. 5 the following relationships hold:

$$i70=i75=i76=i71=ia \qquad (6),$$

and $$i80=2\times ia \qquad (7)$$

where Vin=Vref,

FIG. 6 is a timing chart of the differential circuit of FIG. 5. Input signal Mm stays at L-level in T1, rises from L-level to H-level in T2, stays at H-level in T 3, falls from H-level to L-level in T4, and again stays at L-level in T5.

During time intervals T1 and T5 where input signal Vin stays at L-level in a stationary state, input signal Vin is lower than reference voltage Vref. Thus, the gate-source voltage Vgs of transistor Q71 shown in FIG. 5 is lower than the gate-source voltage Vgs of transistor Q70, and accordingly, current i71 is smaller than current i70. The equality of the gate-source voltage Vgs of transistor Q76 and the gate-source voltage Vgs of transistor Q75 signifies the equality of currents i76 and i75. From the relationships (6) and (7), the following relationship is derived:

$$i70=i75=i76=2\times ia-ib>i71=ib \qquad (8),$$

wherein ib is a constant current.

The current gain charging the gate capacitance of inverter I1 is then expressed by:

$$i76-i71=(2\times ia-ib)-ib=2(ia-ib) \qquad (9).$$

As shown in FIG. 6, the level of output signal Vout in T1 and T5 is around power source voltage Vcc, and the output voltage of inverter I1 is around GND potential. After the charging, relationship i70=i75>i76=i71 holds. Comparing relationship (9) with relationship (3), it is understood that the differential amplifier of FIG. 5 achieves a current gain (or charging current) which is twice the current gain of the differential amplifier of FIG. 3. In other words, output signal Vout of the differential amplifier of FIG. 5 changes to H-level in a higher speed by double compared to the differential circuit of FIG. 3.

When input signal Mm of FIG. 6 is higher than reference voltage Vref in a stationary state, the gate-source voltage Vgs of transistor Q71 is higher than the gate-source voltage Vgs of transistor Q70, and thus i71> i70. Accordingly, contrary to relationship (8), the following relationship holds:

$$i70=i75=i76=2\times ia-ic<i71=ic \qquad (10).$$

The current gain for charging the gate capacitance of inverter I1 is expressed by:

$$i71-i76=ic-(2\times ia-ic)=2(ic-ia) \qquad (11).$$

The level of output voltage Vout falls from around power source voltage Vcc to around GND potential. Output voltage Vout2 of inverter I1 rises to around power source voltage Vcc. After the discharging, relationship i70=i75<i76=i71 holds. Comparing relationship (11) with relationship (5), it is understood that the differential amplifier of FIG. 5 has a discharging current which is twice the discharging current of the differential amplifier of FIG. 3. In other words, output signal Vout of the differential amplifier of FIG. 5 changes to L-level in a higher speed by double compared to the differential circuit of FIG. 3.

During transient time interval T2 where input signal Vin rises L-level to H-level, current i71 gradually increases, and the drain-source voltage Vds of transistor Q76 rises with the discharge of the gate capacitance of inverter I1. At this stage, the current flowing through transistor Q80 is substantially constant, and currents i71 and i75 flowing through transistors Q70 and Q75 decrease. After the discharging, output voltage Vout falls to L-level, and currents i71 and i76 are equal to currents i70 and i75, respectively.

During transient time interval where input signal Mm falls from H-level to L-level, current i71 gradually decreases. At this stage, the substantially constant current flowing through transistor Q80 raises currents i70 and i75 as well as i76. The drain-source voltage Vds of transistor Q76 decreases with the charging of the gate capacitance of inverter I1. Thus, current i76 also decreases and output voltage Vout rises to H-level after the charging. Currents i71 and i76, and currents i70 and i75 reach respective constant levels.

The conventional differential amplifiers shown in FIGS. 3 and 5 involve a problem in that current dissipation increases when external power source voltage Vcc and external input reference Vref change.

Specifically, in the LVTTL standard, as shown in FIG. 1, even if power source voltage Vcc changes, the input level stays at 0.8 volts to 2.0 volts. On the other hand, in the SSTL standard, as shown in FIG. 2, external reference voltage Vref is specified as Vcc×0.45 based on external source voltage Vcc. Accordingly, if 2.9 volts≦Vcc:23 3.7 volts is assured for the operational margin of a memory device, external reference voltage Vref varies within the range of about 1.3 volts≦Vref≦1.7 volts.

In the conventional differential amplifier shown in Fig. 5, external source voltage Vcc input to the gate of transistor Q80 and external reference voltage Vref input to the gate of transistor Q70 raise current dissipation when these external power source voltage Vcc and external reference voltage Vref increase.

Similarly, in the conventional differential amplifier shown in FIG. 3, when Vcc and Vref rise, current dissipation generally increases, although the differential amplifier is capable of suppressing overall current dissipation. Specifically, since transistor Q70 acting as a constant current source and transistor Q75 acting another constant current source may have gate length and gate width independently from each other, it is possible to reduce the current flowing through transistor Q70 without changing the ratio between current drivabilities of transistor Q70 and transistor Q75 as by reducing gate widths W of transistors Q70 and Q75 and increasing gate lengths L thereof to suppress the overall current dissipation.

However, such a configuration employed in the conventional differential circuit of FIG. 3 involves a problem in that the current gain is smaller than that of the differential amplifier of FIG. 5. The smaller current gain involves lower operational speed because the time period for the signal change in the differential circuit is determined by the current gain for charging and discharging the gate capacitance of inverter I1.

SUMMARY OF THE INVENTION

It is therefore an object of the present invention to provide a differential amplifier which is capable of suppressing increase of current dissipation when external source voltage Vcc and external reference voltage Vref increase.

It is another object of the present invention to provide a differential amplifier which has a large current gain for charging and discharging the output line of the differential amplifier.

The present invention provides a differential circuit comprising a current mirror including a pair of first transistors of a first conductivity type each having a source connected to a first source line, a pair of second transistors of a second conductivity type each having a drain connected to a drain of a corresponding one of the first transistors, the second transistors having drains connected together and gates for receiving a reference voltage and an input signal voltage, respectively, and a third transistor of the second conductivity type having a drain connected to the drains of the second transistors, a source connected to a second source line and a gate maintained at a constant voltage which is between voltages of the first source line and the second source line and substantially constant irrespective of a voltage fluctuation of said first and second source line.

In accordance with the differential circuit of the present invention, increase of the current dissipation can be suppressed when external source voltage and reference voltage increase due to the constant voltage applied to the gate of the third transistor.

PREFERRED EMBODIMENTS OF THE INVENTION

Now, the present invention is more specifically described with reference to accompanying drawings, wherein similar constituent elements are designated by same or similar reference numerals throughout the drawings.

Figure 7:
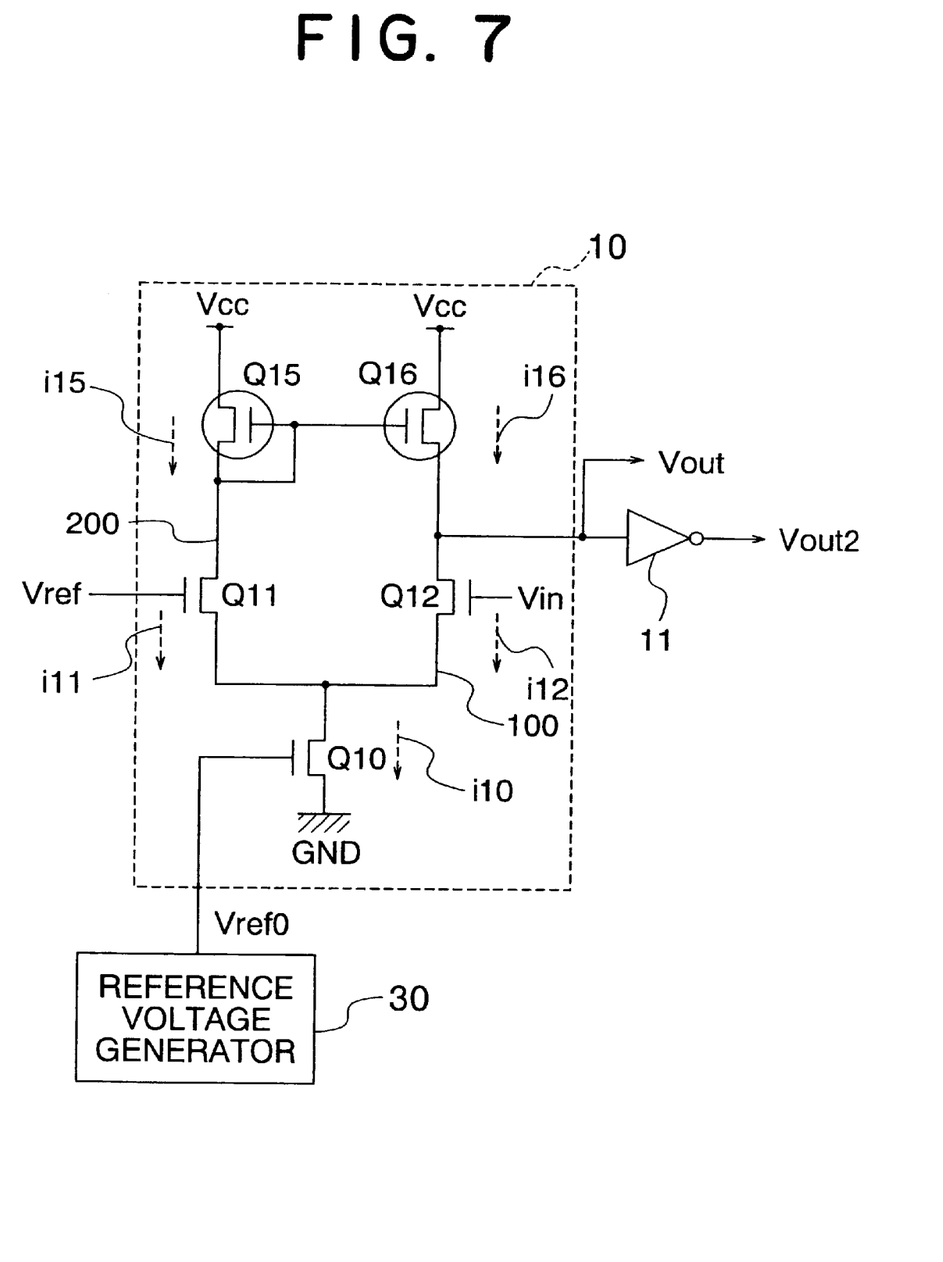
FIG. 7 is a circuit diagram of a differential circuit according to a first embodiment of the present invention.

Referring to FIG. 7, a differential circuit, generally designated by numeral 10, according to a first embodiment of the present invention is disposed in a memory device (not shown) as an input interface thereof. The differential circuit 10 comprises: an N-channel transistor Q10 having a source connected to GND; a differential pair including a pair of N-channel transistors Q01 and Q12 each having a source connected to the drain of transistor Q10 at node 100; and a current mirror including a pair of P-channel transistors Q15 and Q16 each having a source connected to a power source line Vcc and a drain connected to the drain of a corresponding one of the pair of transistors Q11 and Q12. All of the transistors Q10, Q11, Q12, Q15 and Q16 are MOSFETs.

A constant reference voltage Vref0 is applied from a reference voltage generator 30 to the gate of transistor Q10. Constant reference voltage Vref0 is substantially constant even if source voltage Vcc in the memory device fluctuate. An external reference voltage Vref is input to the gate of transistor Q11, and an input signal Vin is input to the gate of transistor Q12 for comparison with external reference voltage Vref in the differential circuit 10. The drain and the gate of transistor Q15 are connected together to the drain of transistor Q11 at node 200. The drain of transistor Q16 is connected to the drain of transistor Q12 at the output node Vout connected to the input of inverter I1. Gates of transistors Q15 and Q16 are connected together.

In the differential amplifier 10 of the present embodiment, fist output voltage Vout is output from the node connecting the drains of transistor Q12 and transistor Q16 which constitute a CMOSFET. Output voltage Vout is supplied to the internal circuit of the memory device as well as to inverter I1, the output Vout2 of which is also delivered to the internal circuit of the memory device.

Assuming that the gate width and gate length of each FET are represented by W and L, respectively, the current drivability "K" of the each FET is proportional to and accordingly may be represented by W/L ratio. In FIG. 7, if current drivabilities "K" of transistors Q10, Q11, Q12, Q15 and Q16 are represented by K(Q10), K(Q11), K(Q12), K(Q15) and K(016), respectively, the differential circuit of FIG. 7 is designed to have the following relationship between these drivabilities:

$$K(Q10):K(Q11):K(Q12):K(Q15):K(Q16)=2.6:9.8:19.5;2.2:4.4 \quad (12).$$

K(Q10) is designed to have a smaller value in order to provide a larger signal amplitude between L-level and H-level of the output signal Vout. Ratios K(Q12)/K(Q11) and K(Q16)/K(Q15) are designed at 2 in relationship (12) to permit transistors Q12 and Q16 to discharge and charge the large gate capacitance of inverter I1 with a larger drivability, whereas transistors Q11 and Q15 need only small drivabilities to charge and discharge a smaller line capacitance associated at node 200.

Ratios K(Q15)/K(Q11) and K(Q16)/K(Q12) are designed for satisfying the following relationship:

$$K(Q15):K(Q11)=K(Q16):K(Q12)=1:4.4 \quad (12a),$$

whereby both pairs of P-channel transistor and N-channel transistor connected in series have the same ratio therebetween as to the ratio of charging drivability to discharging drivability.

The ratio specified by relationship (12a) is designed to to achieve equivalent current drivabilities between the charge and discharge of the output line. Vout in consideration of the smaller drivability of transistor Q10. Specifically, if K(Q11)/K(Q15) or K(Q12)/K(Q16) is designed at 1 or less, for example, then the time length for discharging the gate of inverter I1 through N-channel transistors Q12 and Q10 from H-level to L-level is larger than the time length for charging the gate of inverter 11 through P-channel transistor Q16 from L-level to H-level due to the small current drivability of transistor Q10, which may degrade the device characteristics of the differential circuit.

Figure 8:
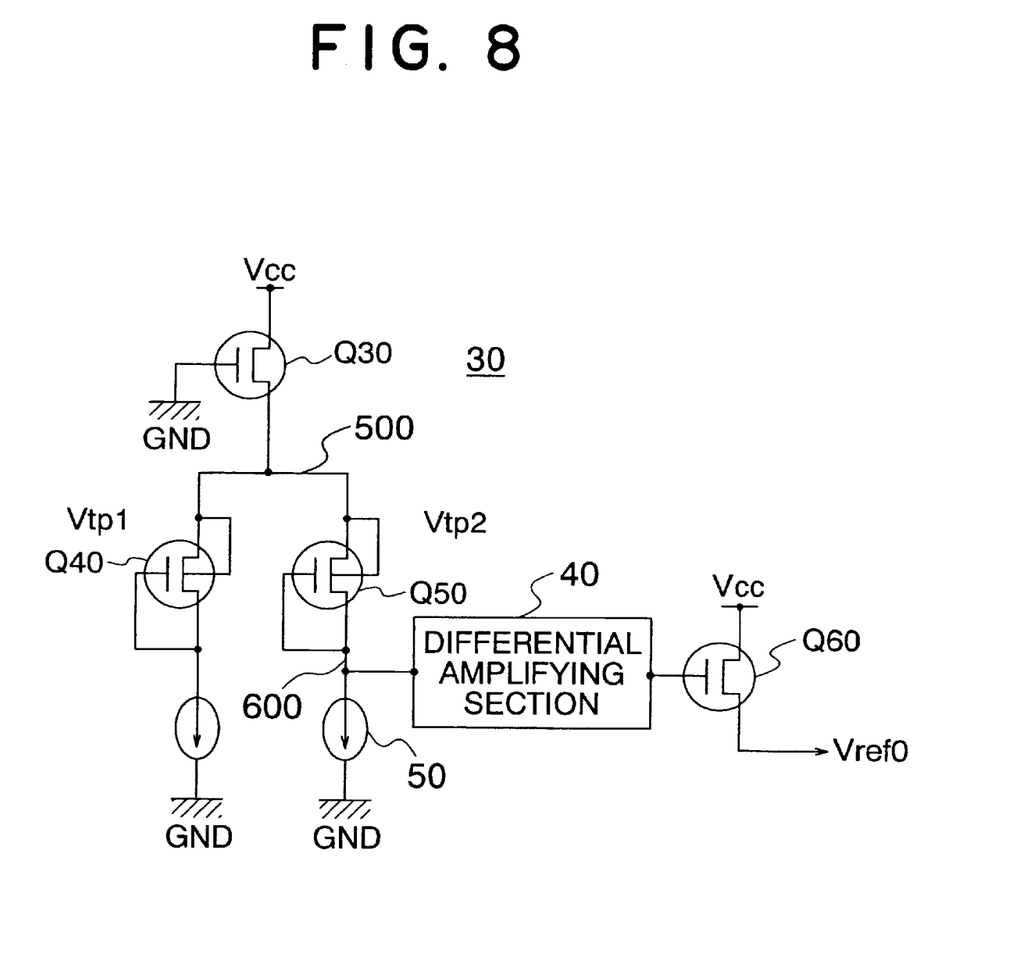
FIG. 8 is a circuit diagram of the reference signal generator shown in FIG. 7.

Referring to FIG. 8, reference voltage generator 30 shown in FIG. 7 comprises: a P-channel transistor Q30 having a source connected to source line Vcc and a gate connected to GND; a P-channel transistor Q40 having a drain and a gate connected together to GND and a source connected to the substrate portion thereof and the drain of transistor Q30; a P-channel transistor Q50 having a drain and a gate connected together to GND through a constant current source 50 at node 600 and a source connected to the substrate portion thereof and to the drain of transistor Q30; a P-channel transistor Q60 having a source connected to source line Vcc; and a differential amplifying section 40 for amplifying the potential level of node 600 to output the amplified potential to the gate of transistor Q60 with a feedback loop (not shown) in the differential amplifying section 40. The reference voltage generator 30 is provided in the memory device comprising the differential circuit of the present embodiment. The reference voltage Vref0 is also used in another circuit in the memory device.

In the above configuration, amplifying section 40 amplifies the difference between threshold voltage Vtp1 of transistor Q40 and threshold voltage Vtp2 of transistor Q50 to supply the output thereof to the gate of transistor Q60. Thus, reference voltage generator 30 generates constant reference voltage Vref0 at the drain of transistor 060. Constant reference voltage Vref0 is lower than power source voltage Vcc, and is constant independently of the fluctuations in the source voltage Vcc or GND potential.

Figure 9:
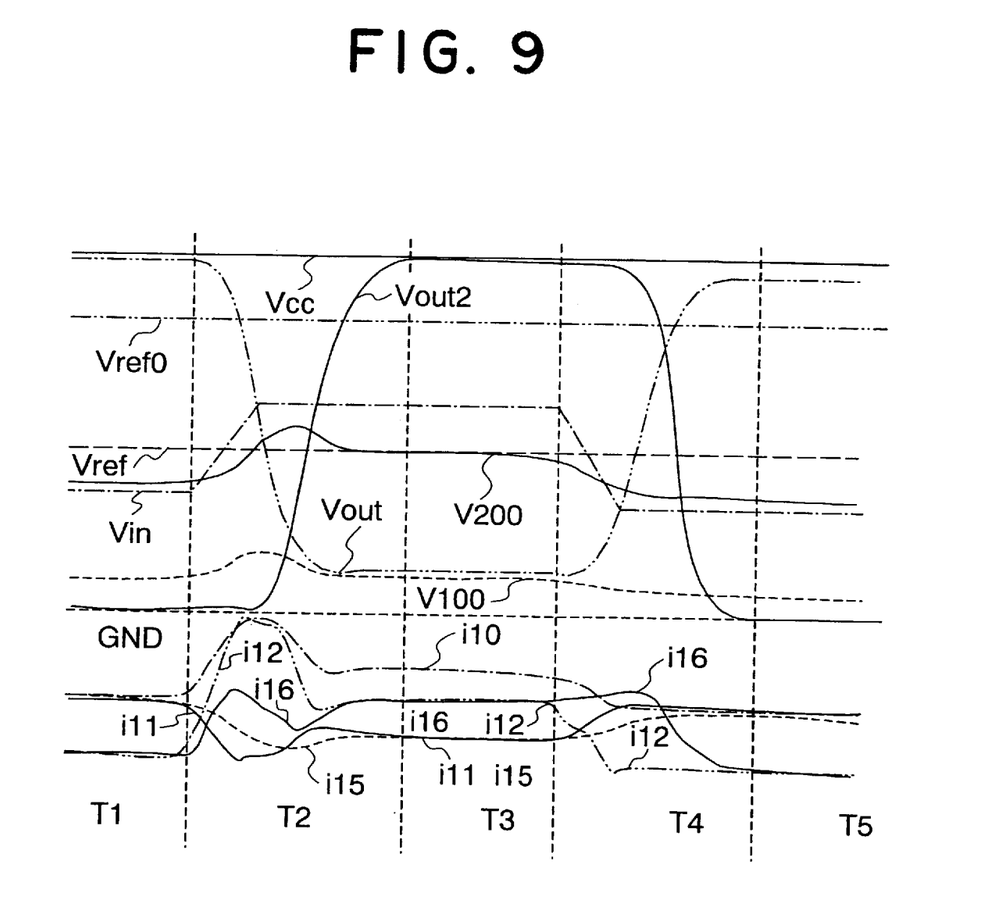
FIG. 9 is signal timing chart of the differential circuit of FIG. 7.

FIG. 9 shows a signal timing chart of the differential circuit 10 of FIG. 7, wherein input signal Vin stays at L-level in T1, rises from L-level to H-level in T2, stays at H-level in T3, falls from H-level to L-level in T4 and stays again at L-level in T5.

In stationary time periods T1 and T5 where input signal Vin stays at L-level, input signal Vin is lower than reference voltage Vref. Thus, the gate-source voltage Vgs of transistor Q12 shown in FIG. 7 is lower than the gate-source voltage Vgs of transistor Q11, whereby current i12 flowing through transistor Q12 is smaller than current i11 flowing through transistor Q11. In the configuration of FIG. 7, i11+i12=i10 and i10 is constant. In addition, the following relationship holds:

$$i11=i15>i12=i16 \quad (13).$$

During stationary time interval T3 where input signal Vin stays at H-level, input signal Vin is higher than reference voltage Vref. Thus, the gate-source voltage Vgs of transistor Q12 is higher than the gate-source voltage Vgs of transistor Q11, and current i12 is larger than current i11. In addition, current i11 and current i15 are equal. In this stationary state of the differential circuit, i12=i16 because the gate of inverter I1 has been entirely charged. Thus, in time period T3, the following relationship holds:

$$i11=i15<i12=i16 \quad (14).$$

During transient time interval 12 where input signal Mm rises from L-level to H-level, relationship (13) holds at the initial stage of T2 while Vin stays at L-level. At the initial stage, the gate-source voltage Vgs of transistor Q12 gradually rises with the rise of input signal Vin from L-level toward reference voltage Vref, and current i12 rises to discharge the gate capacitance of inverter 11, thereby lowering the output signal Vout. At this initial stage, i16 also rises to maintain the level of the input of inverter I1.

The voltage levels of node 100 connecting the source of transistor Q12 and the drain of transistor Q10 together and node 200 connecting the drain of transistor Q15 and the drain of transistor Q11 together rise with the increase of current i12. The rise of nodes 100 and 200 lowers the gate-source voltages Vgs of transistors Q11 and Q15, thereby decreasing currents i11 and i15. Thereafter, input signal Vin further rises to exceed reference voltage Vref and reach the maximum value thereof. At the instant of the maximum value of input signal Vin, the discharge current discharging the output line Vout reaches maximum, and current i12 and i16 also reach their maximum.

Thereafter, discharge current decreases with the fall of output voltage Vout, and current i12 and i16 also decrease. At the end of the discharge, that is, when output voltage Vout reaches the minimum, currents i12 and i16 balance with each other and stay at a constant. On the other hand, currents i11 and i15 reach the minimum when the voltage of input signal Vin reaches the maximum. After the end of discharge of the output line Vout, currents i11 and i15 balance with each other and stay at a constant. At this stage, relationship (14) holds.

During transient time interval T4 where input signal Vin falls from H-level to L-level, relationship (14) holds. The gate-source voltage Vgs of transistor Q12 gradually falls with the fall of input signal Vin from H-level toward reference voltage Vref at the initial stage of T4, as a result of which the gate-source voltage Vgs of transistor Q12 falls, current i12 decreases and current i16 gradually charges the output line Vout to raise the output voltage Vout.

The voltage levels of nodes 100 and 200 fall due to the decrease of current i12. As a result, the gate-source voltage Vgs of transistor Q16 rises to increase currents i16 The voltage level of output signal Vout, however, rises more than the fall of voltage V200 of node 200. Thus, the drain-source voltage Vds of transistor Q16 falls and current i16 decreases as well as current i12.

On the other hand, the potential fall of nodes 100 and 200 raises the gate-source voltage Vgs of transistors Q11 and Q15, thereby increasing currents i11 and i15. Thereafter, input signal Vin further decreases below reference voltage to reach L-level, charging the gate capacitance of inverter I1 by current i16, and currents i12 and i16 finally balance with each other. The voltage levels of nodes 100 and 200 fall as much as current i12 decreases, and currents i11 and i15 also balance with each other after some increase. At this stage, relationship (13) holds.

L-level of output signal Vout does not fall below the potential V100 of node 100. Output signal Vout is input to inverter I1, which delivers output signal Vout2 after a logical inversion. L-level and H-level of output signal Vout are significantly higher than the thresholds of N-channel and P-channel transistors of inverter I1. Thus, output signal Vout2 from inverter I1 shifts in a full-swing level between around power source voltage Vcc and around GND, as shown in FIG. 9.

During time intervals T1 and T5 where input signal Vin is lower than reference voltage Vref, current i10 flowing through transistor Q10 is lower than current i10 when Vin=Vref. On the contrary, current i10 during time interval T3, where input signal Vin is higher than reference voltage Vref, is larger than current i10 when Vin=Vref.

In the differential circuit of the present embodiment, when power source voltage Vcc in the LVTTL standard rises by fluctuation, with the remaining voltages unchanged, increase of current dissipation is suppressed in the present embodiment. Specifically, constant reference voltage Vref0, which is generated by reference voltage generator 30 to have a constant level even if power source voltage Vcc changes, is input to the differential amplifier 10. Thus, even if source voltage Vcc changes, the gate-source voltage Vgs of transistor Q10 does not change. Since the current flowing in the differential amplifier is determined by transistor Q10 having the gate with "W" and gate length "L" which are determined in relationship (12) with those of other transistors Q11, Q12, Q15 and Q16, current i10 is maintained at a constant.

Now, the detailed design of the first embodiment is more specifically described. The gate width/gate length (W/L) of transistors Q10, Q11, Q12, Q15 and Q16 are designed at 2.6 $\mu$m/1.0 $\mu$m, 7.8 $\mu$m/0.8 $\mu$m, 15.6 $\mu$m/0.8 $\mu$m, 2.0 $\mu$m/0.9 $\mu$m and 4.0 $\mu$m/0.9 $\mu$m, respectively. In addition, dimensions (W/L) of P-channel transistor and N-channel transistor in inverter I1 are 4.0 $\mu$m/0.65 $\mu$m and 2.0 $\mu$m/0.55 $\mu$m, respectively. These configuration satisfies relationship (12) and is selected for the reasons as detailed below.

Generally, each input interface in a semiconductor memory device corresponds to one of addresses, commands and I/O pins. In the case of a 64M-bite synchronous DRAM device having 14 addresses, if 8-bit data are to be input/output in a single cycle, 8 commands and 8 I/O pins are provided in the DRAM, totaling 30 pins. The current dissipation generally specified for a 64 mega-bite SDRAM is 6 mA at a pre-charge standby mode. By dividing the current dissipation of 6 mA by 30, allowable current dissipation of each input receiver is about 0.2 mA.

Figure 10A:
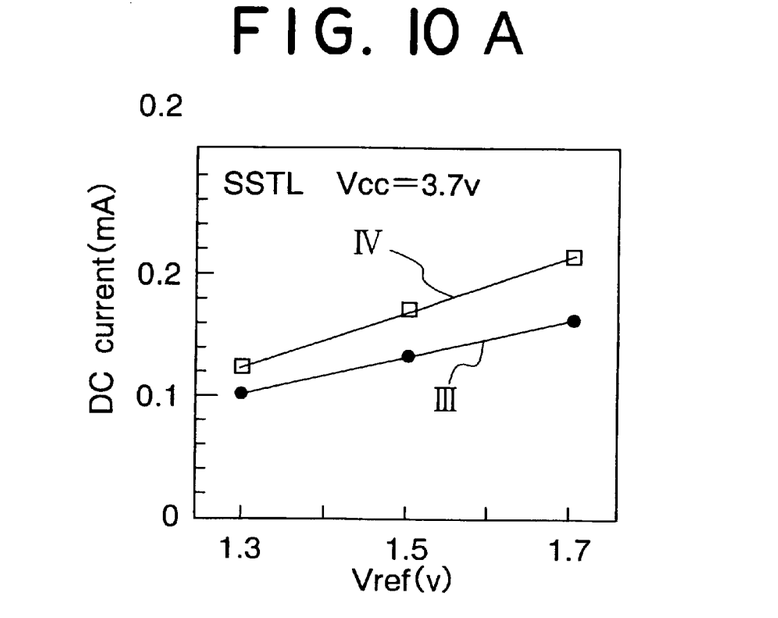
FIG. 10A is a graph of Vref dependence of current dissipation in the differential circuits of FIGS. 5 and 7 specified in the SSTL standard.
Figure 10B:
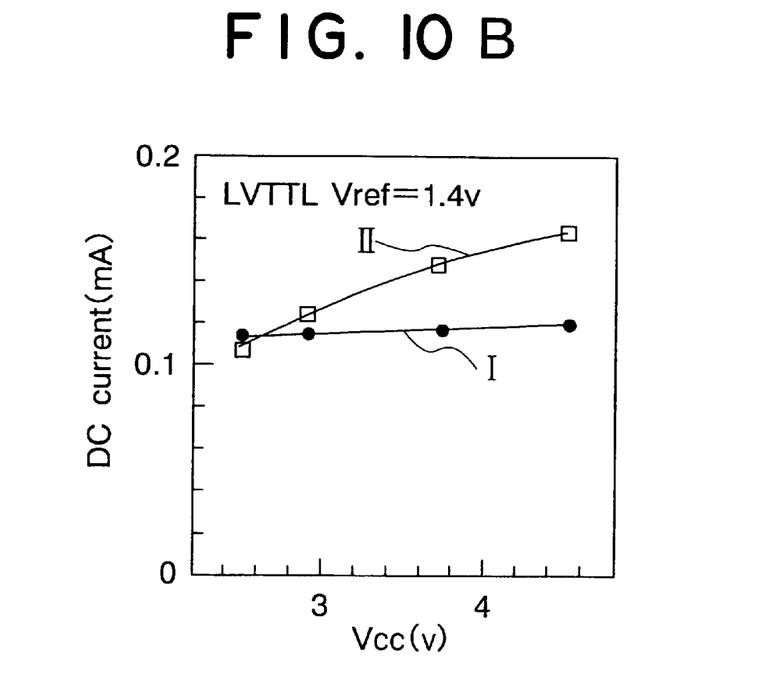
FIG. 10B is a graph of Vcc dependence of current dissipation in the differential circuits of FIGS. 3 and 7 specified in the LVTTL standard.

In the circuit of the present embodiment, the transistor dimensions are designed such that the maximum current under worst condition is 0.2 mA when source voltage Vcc=3.7 volts and reference voltage Vref=1.7 volts in the SSTL standard. FIG. 10A shows reference voltage Vref dependency of current dissipation under such a condition with source voltage Vcc fixed at Vcc=3.7 volts. In the drawing, curves III depicts the current dissipation in the present embodiment,,whereas curves IV depicts current dissipation in the conventional differential circuit. As understood from curves III and IV in FIG. 10A, the current dissipation in the present embodiment is maintained below 0.2 mA, and is improved down to 60% from the conventional 83% when the reference voltage Vref rises from 1.3 volts to 1.7 volts. FIG. 10B shows source voltage Vcc dependency of current dissipation, with reference voltage Vref=1.4 volts fixed, when the differential circuit of the present embodiment is used in the LVTTL standard. As understood from curves I (present embodiment) and II (conventional circuit) in FIG. 10B, increase of the current dissipation is improved in the present embodiment down to below 1% from 52% of the conventional differential circuit when Vcc rises from 2.5 volts to 4.5 volts.

Figure 11:
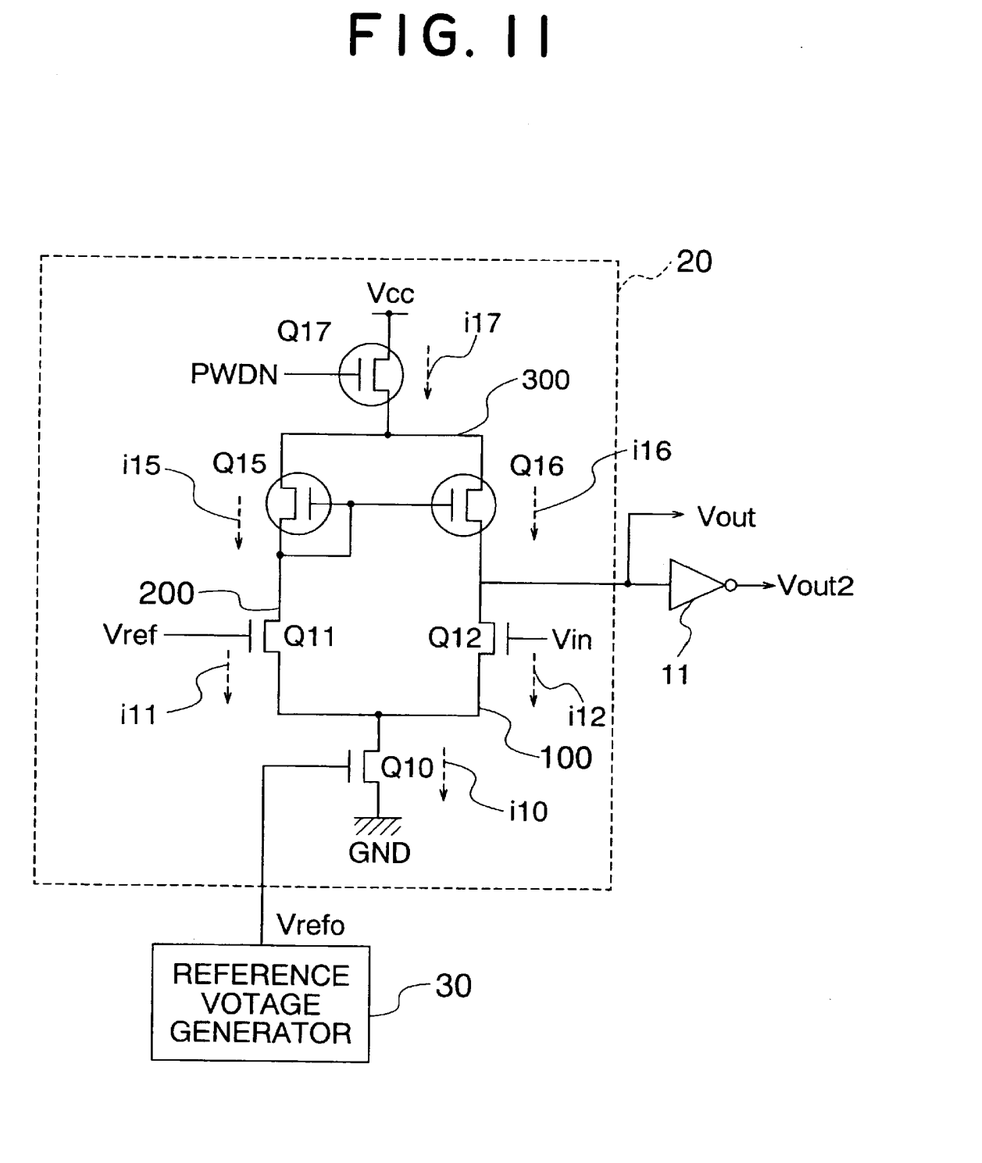
FIG. 11 is a circuit diagram of a differential circuit according to a second embodiment of the present invention.

Referring to FIG. 11, a differential amplifier 20 according to a second embodiment of the present invention is similar to the differential circuit 10 of FIG. 7 except that a P-channel transistor Q17 for switching is provided between source line Vcc and transistors Q15 and Q16 in the present embodiment. P-channel transistor Q17 has a source connected to source line Vcc, a drain connected to the drains of transistors Q15 and Q17 and a gate receiving a power down control signal PWDN.

Figure 12:
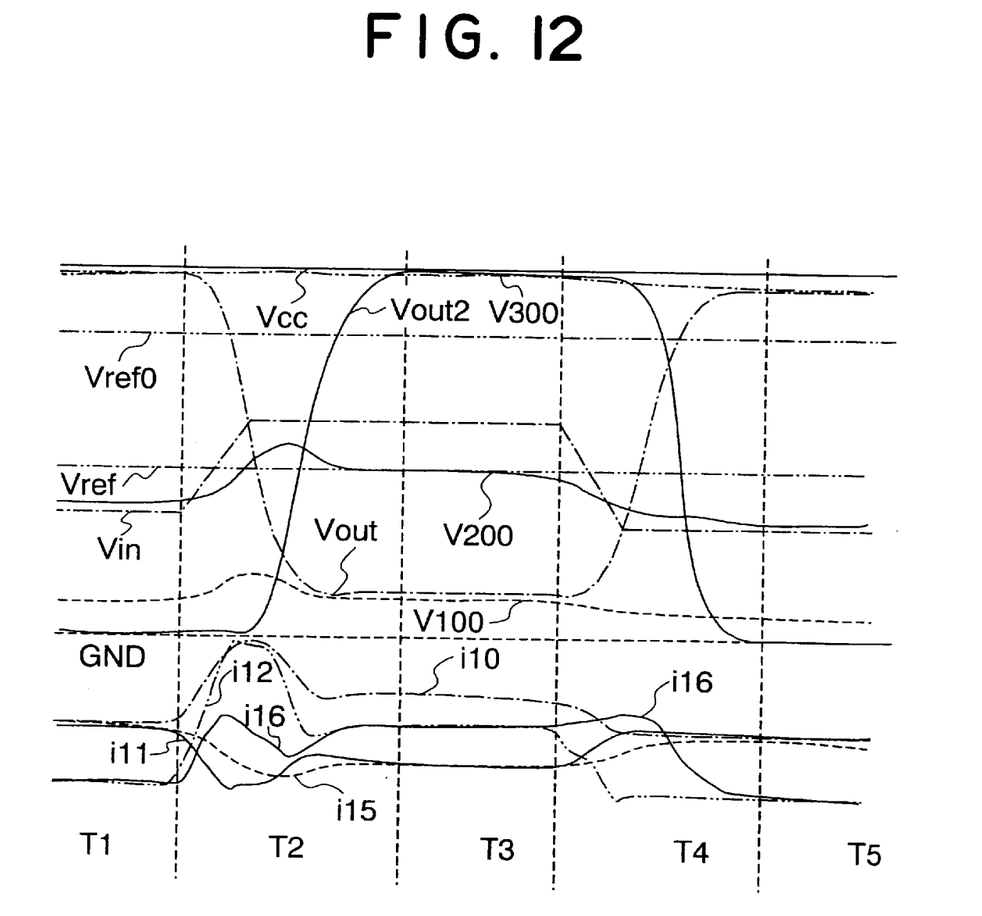
FIG. 12 is signal timing chart of the differential circuit of FIG. 11.

FIG. 12 shows a timing chart of the differential circuit of FIG. 11, wherein power down control signal PWDN controls transistor Q17 between an ON state and an OFF state. During an active interval where power down control signal PWDN assumes L-level or a level lower than the threshold of transistor Q17, current i17 flows through transistor Q17 toward transistors Q15 and Q16, thereby activating the differential circuit of the present embodiment, On the other hand, during an inactive interval where power down control signal PWDN assumes H-level or a level higher than the threshold of transistor Q17, transistor Q17 is OFF to inactivate the differential circuit of the present embodiment. In this configuration, current dissipation is further reduced during inactivation of the differential circuit.

Now the detail of the differential circuit 30 of the second embodiment is more specifically described. The W/L dimensions of each transistor in the second embodiment except transistor Q17 are similar to those in the first embodiment.

Figure 13:
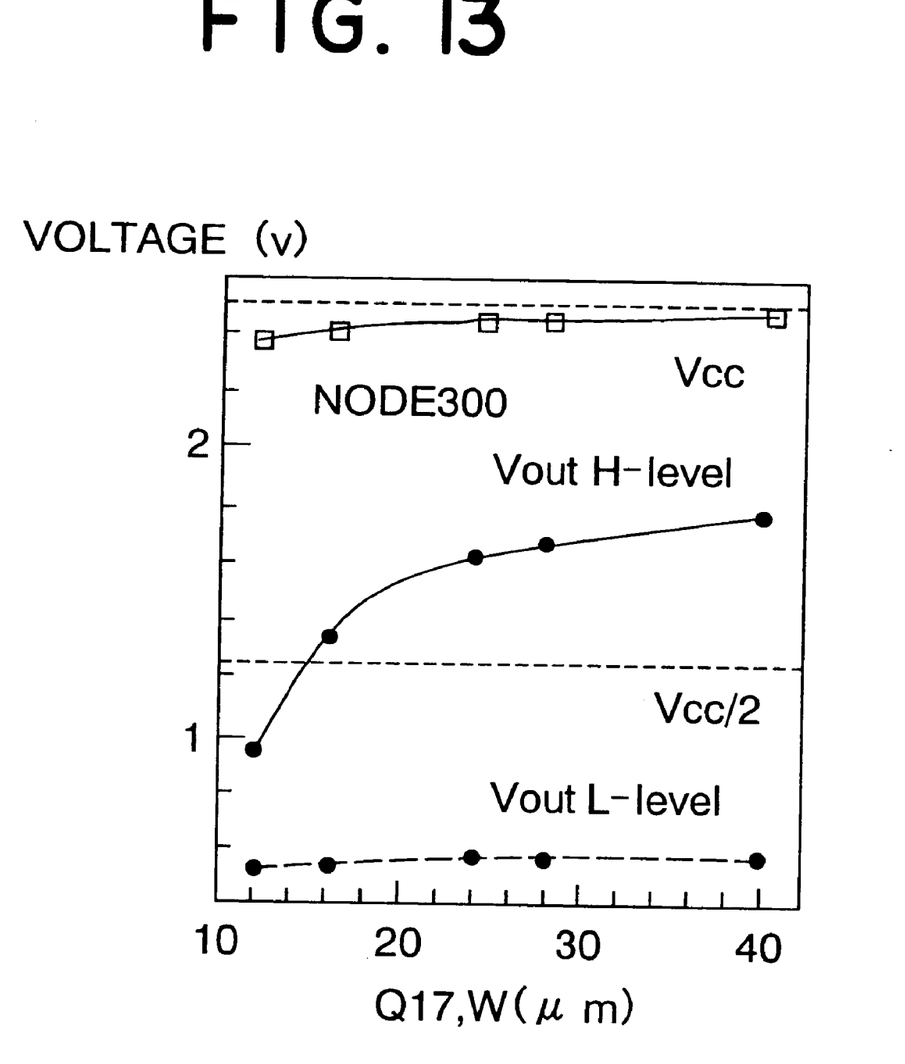
FIG. 13 is a graph showing gate width (W) dependency of the voltages of L-level and H-level of Vout and the level of node 300 in the differential circuit of FIG. 11.

Transistor Q17 has W/L dimensions of 28.0 $\mu$m/0.75 $\mu$m FIG. 13 shows gate width dependence of stationary voltage levels of L-level and H-level at the output line Vout and of the voltage level at node 300 in the second embodiment.

As understood from FIG. 13, a smaller gate width "W" of transistor Q17 lowers the voltage level of node 300 due to less amount of current. As a result, H-level of output signal Vout falls with the reduction of the gate width, crossing the reference voltage of inverter which is Vcc/2 in this case, thereby involving a signal transmission failure. In view of the above, the gate width of transistor Q17 is designed to be 28.0 $\mu$m with some margin.

Since the above embodiments are described only for examples, the present invention is not limited to the above embodiments and various modifications or alterations can be easily made therefrom by those skilled in the art without departing from the scope of the present invention.

What is claimed is:

1. A differential circuit comprising:
   a current mirror including a pair of first transistors of a first conductivity type each having a source connected to a first source line,
   a pair of second transistors of a second conductivity type each having a drain connected to a drain of a corresponding one of said first transistors, said second transistors having sources connected together and gates for receiving a reference voltage and an input signal voltage, respectively, and a third transistor of said second conductivity type having a drain connected to said sources of said second transistors, a source connected to a second source line and a maintained at a constant voltage which is between voltages of said first and second source lines and substantially constant irrespective of a voltage fluctuation of said first and second source lines wherein each of said second transistors has a gate width/gate (W/L) ratio which is larger that a W/L ratio of each of said first transistors, and wherein said third transistor has a W/L ration which is lower than the W/L ratio of each of said first and second first transistors.

2. A differential circuit as defined in claims 1 where:

said source of each of said first transistors is connected to said first source line through a fourth transistor, said fourth transistor having a gate receiving a mode signal for activating or inactivating said differential circuit, and wherein said fourth transistor has a W/L ratio (K17) which satisfies the following relationship with respect to W/L ratio (K15) of one of said second transistors and the W/L ratio (K16) of the other of said second transistors:

$$K17 > 3.2 \times (K15 + K16).$$

3. A differential circuit as defined in claim 1, wherein a first ratio of the W/L ratio of one of said first transistors to the W/L ratio of a corresponding one of said second transistors is substantially equal to a second ratio of the W/L ratio of the other of said first transistors to the W/L ratio of the other of said second transistors.

4. A differential circuit as defined in claim 3, wherein a third ratio of W/L ratio of one of said second transistors to W/L ratio of the other of said second transistors is substantially 1:2.

5. A differential circuit as defined in claim 4, wherein said first ration is substantially 1:4.4.

* * * * *